United States Patent
Gapontsev et al.

(10) Patent No.: US 8,179,934 B2
(45) Date of Patent: May 15, 2012

(54) FREQUENCY CONVERSION LASER HEAD

(75) Inventors: Denis V Gapontsev, Worcester, MA (US); Valentin P Gapontsev, Worcester, MA (US); Alexey Avdokhin, Brookline, MA (US)

(73) Assignee: IPG Photonics Corporation, Oxford, MA (US)

( * ) Notice: Subject to any disclaimer, the term of this patent is extended or adjusted under 35 U.S.C. 154(b) by 654 days.

(21) Appl. No.: 12/152,047

(22) Filed: May 12, 2008

(65) Prior Publication Data

US 2009/0279574 A1  Nov. 12, 2009

(51) Int. Cl.
*H01S 3/13* (2006.01)

(52) U.S. Cl. ............ 372/32; 372/6; 372/21; 372/22; 372/26; 359/326; 359/327; 359/328; 359/329; 359/330; 359/331; 359/332

(58) Field of Classification Search .......... 372/6, 21, 372/22, 23, 26, 32; 359/326–330
See application file for complete search history.

(56) References Cited

U.S. PATENT DOCUMENTS

| | | | |
|---|---|---|---|
| 4,280,109 A | 7/1981 | Stappaerts | |
| 5,422,897 A | 6/1995 | Wyatt et al. | |
| 5,682,398 A * | 10/1997 | Gupta | 372/22 |
| 5,774,484 A | 6/1998 | Wyatt et al. | |
| 5,793,012 A | 8/1998 | Ortiz, Jr. | |
| 5,802,086 A * | 9/1998 | Hargis et al. | 372/22 |
| 5,880,877 A * | 3/1999 | Fermann et al. | 359/341.31 |
| 7,136,402 B1 * | 11/2006 | Ohtsuki | 372/22 |
| 7,339,960 B2 * | 3/2008 | Yamamoto et al. | 372/21 |
| 7,385,752 B1 * | 6/2008 | Starodoumov et al. | 359/326 |
| 7,733,927 B2 * | 6/2010 | Furuya et al. | 372/21 |
| 7,899,105 B1 * | 3/2011 | Hargis et al. | 372/102 |
| 2003/0202547 A1 * | 10/2003 | Fermann et al. | 372/6 |
| 2004/0252734 A1 | 12/2004 | Karpushko | |
| 2007/0297463 A1 * | 12/2007 | Shikii et al. | 372/6 |
| 2008/0137693 A1 * | 6/2008 | Kharlamov et al. | 372/6 |
| 2008/0175283 A1 * | 7/2008 | Ookubo et al. | 372/21 |
| 2009/0185583 A1 * | 7/2009 | Kuksenkov et al. | 372/5 |
| 2009/0279017 A1 * | 11/2009 | Furuya et al. | 349/61 |

* cited by examiner

*Primary Examiner* — Armando Rodriguez
*Assistant Examiner* — Delma R Forde
(74) *Attorney, Agent, or Firm* — Yuri Kateshov; Timothy J. King

(57) ABSTRACT

A laser assembly is configured with a frequency conversion laser head operative to shift a fundamental frequency of input light to the desired frequency of an output light. The frequency conversion laser head includes a dump means operative to guide an unconverted output light at the fundamental frequency outside the case of the frequency conversion laser head. The dump means is configured with a guide optics operative to couple the output light at the fundamental frequency to a fiber terminating outside the case of the frequency conversion laser head.

15 Claims, 2 Drawing Sheets

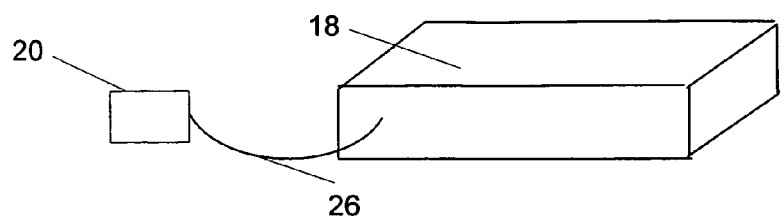
FIG. 3A
FIG. 3B
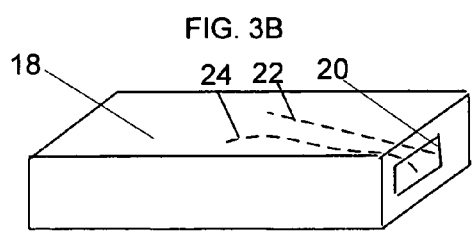
FIG. 4
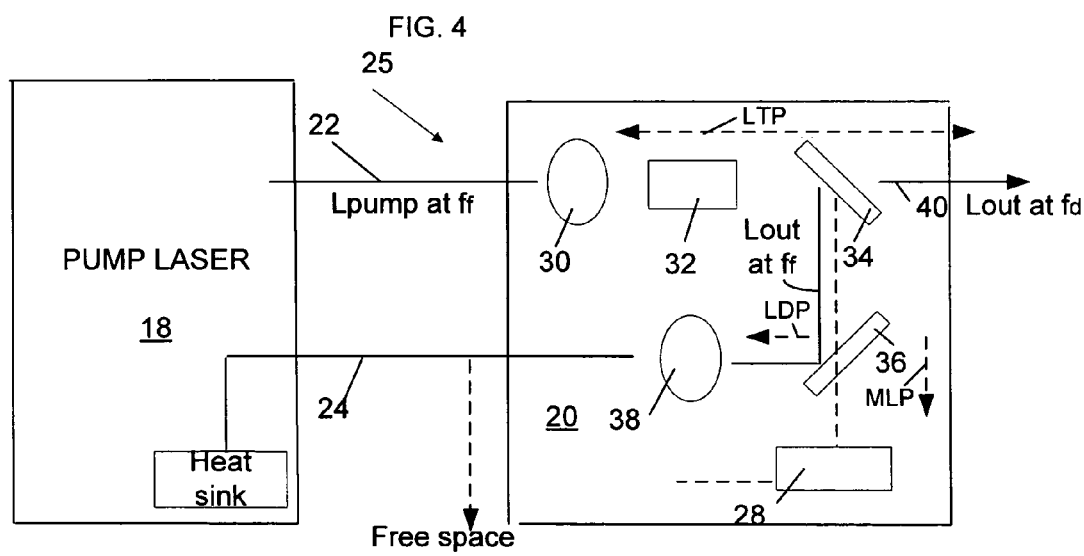
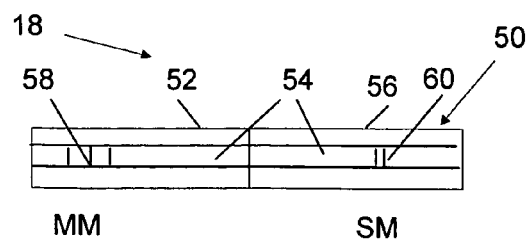
FIG. 5

FREQUENCY CONVERSION LASER HEAD

BACKGROUND OF THE INVENTION

1. Field of the Invention

This invention relates to a frequency conversion laser head with improved heat-diffusing capabilities.

2. Prior Art

Frequency converting laser heads are used in numerous fields including, but not limited to industrial and medical applications. Not all wavelength regions of interest are directly accessible with laser. Therefore, it is common to generate visible light by nonlinear conversion of light. Typically a beam of light of a narrow wavelength illuminates a nonlinear component which doubles, triples and etc. the output frequency of the light.

In a nonlinear frequency conversion process the efficiency of conversion of laser power at a fundamental frequency into power at combined frequencies, such as the second, third and other harmonic frequencies, is strongly dependent on the intensity of radiation interacting with the non-linear optical material. In practice, high intensities are needed to reach laser output powers up to tens of watts and higher so desirable by the market. The high intensities are accompanied by elevated temperatures which are detrimental to the desired functionality of a laser head explained in detail immediately hereinbelow.

Referring to FIG. 1, a laser unit 10 includes a laser module 12 and a frequency conversion laser head 14. The laser module 12 may be configured as a solid state or all fiber laser outputting a pump light at a fundamental frequency. The pump light is coupled to an output component 16 and delivered to laser head 14 where it impinges upon a frequency conversion component. The latter, in turn, converts the fundamental frequency of the pump radiation into the desired frequency. The output light at the desired frequency is finally delivered to the object to be treated.

Not all of the pumped radiation is converted into the desired frequency. In fact, only a small portion of the pumped light is usefully converted; the other, large portion of the pumped radiation remains unchanged and, therefore, useless. For example, the pump light, coupled to laser head 14, has a power of 10 W. As a result of the frequency conversion, the output light delivered to the object to be treated at the desired frequency has a power of about 2 W. The other 8 watts of the pump light exiting the non-linear frequency component at the fundamental frequency create a thermally-hazardous situation within laser head 14, which can possibly lead to a completely unsatisfactory operation of the laser. To somewhat minimize the thermal effect, the laser head has a greater volume that renders it space-ineffective. Yet, to the best of the applicant's knowledge, this configuration of the laser head is predominant in the laser industry.

It is, therefore, desirable to provide a frequency conversion laser head configured to minimize the thermal effect of the unconverted pump radiation.

It is also desirable to provide a laser assembly configured with the improved frequency conversion laser head, as disclosed immediately above.

SUMMARY OF THE INVENTION

These objectives are attained by a laser assembly configured in accordance with the present disclosure and capable of coupling a pump radiation at undesirable frequency out of the case of a frequency conversion laser head. In particular, the disclosed frequency conversion laser head is configured with a heat dump assembly operative to couple unconverted pump radiation out of the laser head's case.

Preferably, the disclosed dump assembly includes an optical filter capable of separating desired frequencies of output light which exits a non-linear conversion element from fundamental, unconverted frequencies. The unconverted output light is steered towards and coupled into a dump fiber that guides the output light outside the case of the laser head.

Evacuating the unconverted light from a laser head allows for a compact structure of the laser head and minimizes detrimental thermal effects on the proper functionality of components of the frequency conversion laser head.

BRIEF DESCRIPTION OF THE DRAWINGS

The above and other features and advantages of the present disclosure will become more readily apparent from a further specific description accompanied by the following drawings, in which:

FIGS. 3A and 3B are respective diagrammatic orthogonal views of different modification of the laser system of FIG. 2.

FIG. 4 is a diagrammatic optical schematic of the laser system configured in accordance with the present disclosure.

FIG. 5 is a view of the laser system of FIG. 3

SPECIFIC DESCRIPTION

Figure 1:
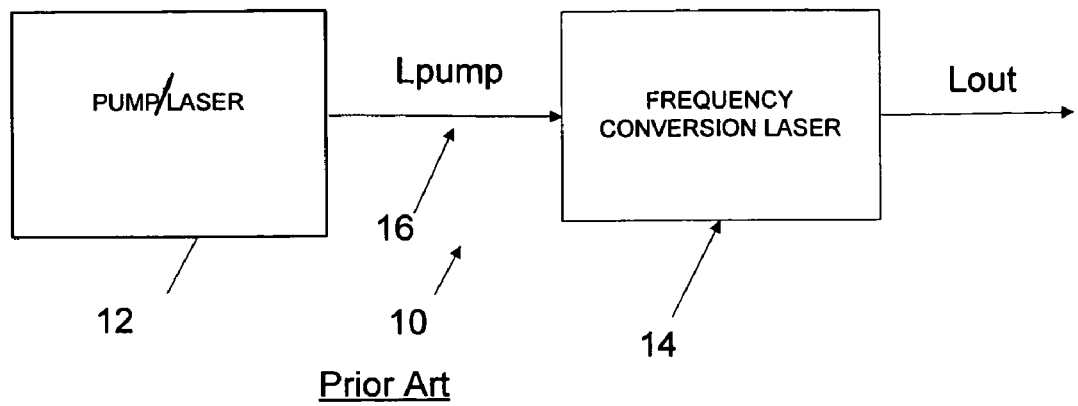
FIG. 1 is a schematic view of a typical laser assembly including the frequency conversion laser head of the known prior art.

Reference will now be made in detail to the disclosed system. Wherever possible, same or similar reference numerals are used in the drawings and the description to refer to the same or like parts or steps. The drawings are in simplified form and are far from precise scale. For purposes of convenience and clarity only, the terms "connect," "couple," and similar terms with their inflectional morphemes do not necessarily denote direct and immediate connections, but also include connections through mediate elements or devices.

Figure 2:
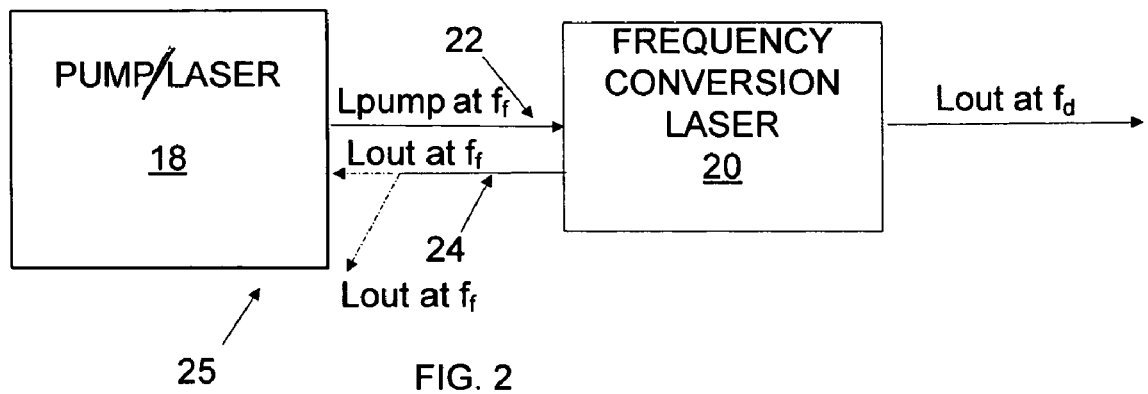
FIG. 2 is a schematic view of a laser assembly configured in accordance with the present disclosure.

FIG. 2 illustrates a diagrammatic view of the disclosed laser assembly 25 including a laser system or pump laser module 18 and a frequency conversion laser head 20. An input component 22 couples a pump light beam Lpump at a fundamental frequency $f_f$ to frequency conversion laser head 20, which is operative to shift the fundamental frequency ff of pump light Lpump to a desired frequency fd. The light Lpump is processed inside the case of laser head 20 so that it splits into an output light beam Lout at the desired frequency fd and an output light Lout at the fundamental frequency ff, as explained hereinbelow.

In accordance with one aspect of the disclosure, light Lout at fundamental frequency ff is coupled into a dump fiber 24 guiding light Lout outside frequency conversion laser head 20. As a consequence and in contrast to the known prior art, the heat generated by the reflected light beam does not accumulate inside the laser head that, thus, does not experience overheating while featuring a compact structure.

Referring to FIGS. 3A and 3B, frequency conversion laser head 20 may be configured as a separate component detachably coupled to laser system or pump laser module 18, or may be manufactured and marketed in combination therewith. In either configuration, frequency conversion laser head 20 may be coupled to system 18, so that these components are displaceably fixed to one another in a single case (FIG. 3B). In accordance with this modification, input and output dump fiber waveguides 22 and 24, respectively, are mounted inside laser system 18. Alternatively, as shown in FIG. 3A, frequency conversion laser 20 is configured as a separate component flexibly coupled to system 18 so that these two components are detachably coupled to and displaceable relative to one another. Typically, laser module 18 and head 20 are coupled by a flexible hollow component 26 (FIG. 3A) which houses input fiber 22 and dump fiber 26.

FIG. 4 illustrates an optical schematic of disclosed assembly 25 in which frequency conversion laser head 20 is detachably coupled to input fiber waveguide 22 guiding pump light Lpump at fundamental frequency ff from pump 18. The input fiber waveguide 22 launches the Lpump light beam inside the case of laser head 20. The pump light is guided along a light transmission path (LTP) by well known optical elements, such as a focusing lens 30 coupling the focused pump light to a nonlinear frequency conversion component 32 which is operative to shift the fundamental frequency ff to other desired frequencies fd. The light exiting nonlinear component 32 at fundamental and desired frequencies is incident upon a beam splitter 34 locating along the transmission light path. Configured to separate the desired frequency from the fundamental frequency, beam splitter 34 reflects light beam Lout at fundamental frequency ff along a light dump path (LDP) which extends in a plane transverse to the plane of the transmission light path. The light beam Lout at desired frequency fd propagates through beam splitter 34 without deviation from the light transmission path LTP and is coupled by an output focusing optics (not shown) to an output delivery fiber, which is preferably, but not necessarily, a single-mode fiber 40. The beam splitter 34 preferably has at least one reflecting surface covered with dielectric material; as a consequence, beam splitter is transmissive to the entire light beam Lout at the desired frequency except for a small portion thereof which is tapped off for power monitoring purposes, as explained hereinbelow.

The nonlinear frequency conversion component 32 is based on a non-linear response of the polarization of the material caused by the electric field of the pump light beam. The degree of non-linear response is governed by the magnitude of the non-linear susceptibility of the material. The effect of this non-linear response is to shift the frequency of the pump light beam to other frequencies. Examples of nonlinear frequency conversion component 32 includes: second harmonic generation, sum and difference frequency generator, third and higher harmonic generation, stimulated Raman shifting, optical parametric oscillation and others and any combination of these.

As the output light beam Lout at fundamental frequency ff propagates along the light dump path DLP, it initially impinges upon a dump mirror 36 which is configured similarly to beam splitter 34 and guides light Lout fundamental frequency ff towards an output dump focusing lens 38. The latter couples the light beam Lout at fundamental frequency ff to multimode dump fiber 24 which guides it outside frequency conversion laser head 20. In accordance with one modification of the present disclosure, multimode dump fiber 24 terminates inside the housing of system or pump module 18. Alternatively, dump fiber may guide the unconverted light into free space, as illustrated in FIGS. 2 and 4 by dash lines.

The desired wavelengths are subject only to a particular configuration of non-linear conversion component 32. For example, frequency conversion laser head 20 is configured to operate in combination with CW or pulsed laser, which is pumped by pump light Lpump at 1064 and/or 1550 nm and has an average power approaching 20 W. The pump light radiation Lpump is launched in nonlinear frequency conversion component 32 configured from a 30 mm long lithium niobate crystal which is periodically poled. The crystal is operative to upconvert pump radiation Lpump to 775 nm output light beam Pout carried along the light transmission path with an output power of about 2 W. The unconverted pump light Lout at fundamental frequency ff is separated from the second radiation harmonic and further guided outside frequency conversion laser head 20 upon coupling into 100 micron-core MM fiber 24. As readily apparent to one of ordinary skills in the art, the dielectric layer deposited on splitters 34 and 36 may be configured to fully reflect not only the light at fundamental frequency, but also a Raman component thereof which has a wavelength different from both, the fundamental and desired wavelengths.

In accordance with a further aspect of the disclosure, frequency conversion laser head 20 is provided with a power monitor 28 operative to reliably measure the power of output light beam Lout at desired frequency fd which is carried by output fiber 40. As mentioned above, beam splitters 34 and 36 may be configured so that a small portion of output light beam Lout at desired frequency fd is reflected along the light dump path LDP. The mirror 36 is transparent for the light at desired frequency fd which propagates through splitter/mirror 36 along a measuring light path (MLP) and is incident on power monitor 28 located downstream from mirror 36 along the measuring light path. The power monitor 28 is coupled to a processing unit (not shown) provided with software which is operative to alter the power of pump light beam Lpump, if a measured value deviates from the reference value.

The laser system/pump module laser 18, as mentioned above, may be configured as a solid state laser or a fiber laser and operate in a CW or pulsed regime. The solid state laser pump 18 may be configured based on, for example, the Nd:YAG laser rod, Al2O3Ti rod, alexandrite rod and many others, well known to one of ordinary skills in the laser art. The pulsed operation may include Q-switched operation. In conjunction with solid state laser, nonlinear conversion component 32 may include, for example, potassium dihydrogen phosphate (KDP), potassium dideuterium phosphate (KD*P), ammonium dihydrogen phosphate (ADP), potassium titanium oxide phosphate (KTP), rubidium dihydrogen phosphate (RDP), rubidium dihydrogen arcenate (RDA), cesium dihydrogen arsenate (CDA), lithium iodate ($LiIO_3$), lithium niobate ($LiNbO_3$) and others.

Referring to FIG. 5, laser system 18 is based on a fiber waveguide doped with Er, Yb, Er/Yb, Th and other suitable rare earth elements. The fiber laser modules may include a single laser fiber block provided with a resonant cavity. In addition, it may be configured with a single or multiple amplification fiber blocks.

FIG. 5, disclosed in conjunction with FIG. 4, illustrates a gain fiber block 50 of laser system 18 based on a multimode (MM) fiber 52 which is pumped by one or more laser diodes (not sown). The MM active fiber 52 has a core 54 capable of supporting a fundamental mode at the desired frequency. To output light pump beam Lout, a single mode passive fiber 56 is directly spliced in the end-to-end configuration to MM fiber 52 without the use of a mode converter.

The core sizes of respective fibers 52 and 56 are chosen so that the fundamental mode diameter of MM fiber 52 substantially matches that one of SM fiber 56 to provide efficient coupling of the fundamental mode between the fibers at their coupled ends. The MM fiber are so configured that the fundamental mode of MM fiber 52 propagates clown its core 54 without significant coupling of power into higher order modes.

The laser of FIG. 5 forces oscillation in the fundamental mode and actively prevents lasing in the higher order modes in the following way: oscillation of the fundamental mode only is forced by the monomode fiber waveguide and grating 60 which is written into SM fiber 56. The grating partially reflects the fundamental mode signal back into MM fiber 52 such that the reflected fundamental mode signal does not couple to higher order modes. The grating 60, in effect, ensures partial reflection of only the fundamental mode, which increases discrimination against higher order modes in MM fiber 52. Therefore, due to highly predominant fundamental mode oscillation, emission is stimulated in the fundamental mode only.

As mentioned above, the fiber gratings can be replaced with mirrors. In fact, as long as some form of reflector arrangement with the required reflectivities is present in the system, whether they are internal reflectors written into the waveguides, external reflectors, or a combination of internal and external reflectors, the system should operate as described by outputting substantially SM pump light beam Lpump at the fundamental frequency ff which is coupled to input SM fiber 22 of FIGS. 3 and 4.

The fiber/gain block 50 is illustrated to have a resonant cavity defined between two reflective components, such as mirrors or, preferably, fiber gratings 58 and 60. As well understood by one of ordinary skills in the laser art, a single or multiple amplification fiber blocks can be configured identically to fiber block 50 only without the reflective components.

The laser of FIG. 5 operates by coupling a laser diode light beam to MM fiber 52. The method of coupling may include an end pumping technique and a side pumping technique. The MM fiber 52 is, preferably, a large mode area, multi-cladding fiber. The laser diode light beam provides a signal at a first wavelength. In response, MM fiber 5 is capable of laser action with an emission at the fundamental frequency ff while exhibiting multimode behavior at the fundamental frequency. One of the opposite ends of SM fiber 56, which exhibits substantially single mode behavior at the fundamental frequency, is fusion spliced to the opposing end of MM fiber 52. Finally, the optical cavity is defined between reflective components 58 and 60, respectively, and includes at portions of MM and SM fibers. Note that the amplification block would be provided with a MM fiber having its opposite ends spliced to respective SM fibers, wherein the upstream SM fiber would be spliced to SM fiber 56 of block 50.

A variety of changes of the disclosed structure may be made without departing from the spirit and essential characteristics thereof. Thus, it is intended that all matter contained in the above description should be interpreted as illustrative only and in a limiting sense, the scope of the disclosure being defined by the appended claims.

The invention claimed is:

1. A laser assembly comprising a frequency conversion laser head receiving at a fundamental frequency, and comprising:
   a case;
   a non-linear conversion component housed in the case and operative to convert a portion of the light to a desired frequency;
   a beam splitter mounted in the case and configured to transmit the converted light portion along a transmission path and reflect an unconverted portion of the light at the fundamental frequency along a light dump path;
   an output fiber located along the transmission path and receiving the converted light portion at the desired frequency; and
   a dump fiber partially housed in the case along the dump path and configured to receive and launch the unconverted light portion at the fundamental frequency outside the case;
   a mirror located downstream from the beam splitter along the dump light path and configured to reflect the light at the fundamental frequency towards the dump fiber; and
   a dump focusing optics downstream from the mirror and operative to couple the output light at the fundamental frequency into the dump fiber.

2. The laser assembly of claim 1, wherein the beam splitter and mirror each are covered with a layer of dielectric material, the beam splitter being configured to tap off a fraction of the converted light portion at the desired frequency along the light dump path, the mirror being transparent to the tapped off fraction.

3. The laser assembly of claim 2 further comprising a power monitoring unit housed in the case downstream from the mirror along a measuring light path, which deviates from the light dump path, and operative to measure the tapped off fraction of the converted light portion at the desired frequency so as to determine a power thereof.

4. The laser assembly of claim 1, wherein the output fiber is partially housed in the case and guides the converted light portion of the output light at the desired frequency at an object to be treated outside the case.

5. The laser assembly of claim 1 further comprising a laser system operative to generate the light at the fundamental frequency which is coupled into an input fiber optically coupling the laser system and the frequency conversion laser head to one another.

6. The laser assembly of claim 5, wherein the laser system and frequency conversion laser head are displaceably fixed to one another.

7. The laser assembly of claim 5, wherein the laser system and frequency conversion laser head are displaceable relative to one another.

8. The laser assembly of claim 5, wherein the laser system is configured as a solid-state laser.

9. The laser assembly of claim 5, wherein the laser system is configured as an all fiber laser.

10. The laser assembly of claim 9, wherein the fiber laser includes at least one fiber block configured with:
    an multimode (MM) fiber operative to lase the light substantially in a fundamental mode at the fundamental frequency; and
    a single mode (SM) fiber, opposing ends of the respective MM and SM fibers being fusion spliced together.

11. The laser system of claim 10 further comprising an optical cavity defined between multiple reflectors and including at least adjacent portions of the respective MM and SM fibers.

12. The laser system of claim 10, wherein the SM fiber is directly or indirectly coupled to the frequency conversion laser head.

13. A frequency conversion laser head receiving light at a fundamental frequency and comprising:
    a case;
    a non-linear conversion component housed in the case and operative to convert a portion of the light at the fundamental frequency to a desired frequency;
    a beam splitter mounted in the case and configured to transmit the converted light portion along a transmission path and reflect an unconverted portion of the light at the fundamental frequency along a dump path;
    an output fiber located along the transmission path and receiving the light portion at the desired frequency;

a dump fiber partially housed in the case along the dump path and configured to receive and launch the unconverted portion of the light at the fundamental frequency outside the case;

a mirror located downstream from the beam splitter along the dump light path and configured to reflect the unconverted light portion at the fundamental frequency towards the dump fiber; and a dump focusing optics downstream from the mirror and operative to couple the unconverted light portion at the fundamental frequency into the dump fiber.

14. The frequency conversion laser head of claim 13, wherein the beam splitter and mirror each are covered with a layer of dielectric material, the beam splitter being configured to tap off a fraction of the converted light portion at the desired frequency along the light dump path, the mirror being transparent to the tapped off portion.

15. The frequency conversion laser head of claim 14 further comprising a power monitoring unit housed in the case downstream from the mirror along a measuring light path, which deviates from the light dump path, and operative to measure the tapped off fraction of the converted light portion at the desired frequency so as to determine a power thereof.

* * * * *